(12) United States Patent
Kim et al.

(10) Patent No.: US 11,670,238 B2
(45) Date of Patent: Jun. 6, 2023

(54) DISPLAY APPARATUS

(71) Applicant: SAMSUNG DISPLAY CO., LTD., Yongin-si (KR)

(72) Inventors: Jeonghun Kim, Yongin-si (KR); Byeongguk Jeon, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/154,359

(22) Filed: Jan. 21, 2021

(65) Prior Publication Data

US 2021/0142737 A1   May 13, 2021

Related U.S. Application Data

(63) Continuation of application No. 16/392,050, filed on Apr. 23, 2019, now Pat. No. 10,909,930.

(30) Foreign Application Priority Data

Jun. 25, 2018 (KR) .......................... 10-2018-0072505

(51) Int. Cl.
*G09G 3/3266* (2016.01)
*G09G 3/3275* (2016.01)
(Continued)

(52) U.S. Cl.
CPC ......... *G09G 3/3266* (2013.01); *G09G 3/3275* (2013.01); *H01L 27/3276* (2013.01);
(Continued)

(58) Field of Classification Search
CPC ............... G09G 3/3266; G09G 3/3275; G09G 2300/0842; G09G 3/3225;
(Continued)

(56) References Cited

U.S. PATENT DOCUMENTS 9,865,670 B2 * 1/2018 Park .................... H01L 51/0097
10,354,578 B2   7/2019 Ka et al.
(Continued)

FOREIGN PATENT DOCUMENTS

CN            108039148       5/2018
KR     10-2009-0071045       7/2009
(Continued)

OTHER PUBLICATIONS

European search report dated Oct. 25, 2019 issued in corresponding European Patent Application No. 19180653.8.

*Primary Examiner* — Amy Onyekaba
(74) *Attorney, Agent, or Firm* — F. Chau & Associates, LLC

(57) ABSTRACT

A display apparatus includes a substrate including a trench portion, a display area, and a non-display area. The non-display area includes a first non-display area. The display area includes a main area and first and second display areas protruding from the main area. The first non-display area and the trench portion are between the first and second display areas. The display apparatus further includes: first scan lines transmitting scan signals to pixels in the first display area; second scan lines transmitting scan signals to pixels in the second display area; connection scan lines in the first non-display area and connecting the first scan lines and the second scan lines; and driving voltage lines transmitting driving voltages to pixels in the main area. A plurality of first driving voltage lines among the driving voltage lines extend to the first non-display area, and overlap the plurality of connection scan lines.

15 Claims, 11 Drawing Sheets

(51) Int. Cl.
    *H01L 27/32*         (2006.01)
    *H01L 51/00*         (2006.01)
    *H01L 51/52*         (2006.01)

(52) U.S. Cl.
    CPC ...... *H01L 51/0096* (2013.01); *H01L 51/5253* (2013.01); *H01L 27/3246* (2013.01)

(58) Field of Classification Search
    CPC ... G09G 2300/0413; G09G 2300/0426; G09G 2310/0281; G09G 2320/0223; G09G 3/20; H01L 27/3276; H01L 51/0096; H01L 51/5253; H01L 27/3246; H01L 51/52; H01L 51/50; G02F 2201/56; G02F 1/136286; Y02E 10/549
    See application file for complete search history.

(56) References Cited

U.S. PATENT DOCUMENTS

| | | | | |
|---|---|---|---|---|
| 10,482,811 | B2* | 11/2019 | Kang | H01L 27/3276 |
| 10,580,850 | B2* | 3/2020 | Lee | H01L 27/3258 |
| 11,430,858 | B2* | 8/2022 | Song | H01L 27/3279 |
| 2008/0225216 | A1* | 9/2008 | Shimodaira | G02F 1/1362 |
| | | | | 349/143 |
| 2010/0026611 | A1 | 2/2010 | Igeta et al. | |
| 2017/0162637 | A1* | 6/2017 | Choi | H01L 27/3276 |
| 2017/0207416 | A1* | 7/2017 | Kim | H01L 51/504 |
| 2017/0288002 | A1* | 10/2017 | Kim | H01L 51/0097 |
| 2017/0294502 | A1* | 10/2017 | Ka | H01L 27/3276 |
| 2017/0301280 | A1* | 10/2017 | Ka | H01L 27/3223 |
| 2017/0358641 | A1 | 12/2017 | Park et al. | |
| 2018/0129106 | A1* | 5/2018 | Gao | G02F 1/13781 |
| 2018/0145127 | A1* | 5/2018 | Shin | H01L 51/5253 |
| 2019/0019789 | A1 | 1/2019 | Kim et al. | |
| 2019/0109184 | A1* | 4/2019 | Li | H01L 27/3248 |
| 2019/0164489 | A1* | 5/2019 | Zhang | G09G 3/3266 |
| 2019/0181213 | A1* | 6/2019 | Lim | G09G 3/3225 |
| 2019/0214600 | A1* | 7/2019 | Park | G09G 3/3266 |
| 2019/0259349 | A1* | 8/2019 | Kaise | G02F 1/1345 |
| 2019/0265824 | A1* | 8/2019 | Abe | G06F 3/0443 |
| 2019/0363266 | A1* | 11/2019 | Tanaka | H01L 27/322 |
| 2019/0392767 | A1 | 12/2019 | Kim et al. | |
| 2022/0262854 | A1* | 8/2022 | Park | H01L 33/38 |

FOREIGN PATENT DOCUMENTS

| | | |
|---|---|---|
| KR | 10-2011-0066333 | 6/2011 |
| KR | 10-2014-0075320 | 6/2014 |
| KR | 10-2017-0119270 | 10/2017 |
| KR | 10-2019-0008459 | 1/2019 |
| WO | 2017172375 | 10/2017 |

\* cited by examiner

DISPLAY APPARATUS

CROSS-REFERENCE TO RELATED APPLICATIONS

This application is a continuation of U.S. patent application Ser. No. 16/392,050 filed on Apr. 23, 2019, which claims priority under 35 U.S.C. § 119 to Korean Patent Application No. 10-2018-0072505, filed on Jun. 25, 2018, in the Korean Intellectual Property Office, the disclosures of which are incorporated by reference herein in their entireties.

TECHNICAL FIELD

Exemplary embodiments of the present invention relate to a display apparatus, and more particularly, to a display apparatus including driving voltage lines and connection scan lines.

DISCUSSION OF THE RELATED ART

A display apparatus is configured to visually display data. A typical display apparatus includes a substrate divided into a display area and a non-display area. In the display area, a scan line and a data line, insulated from the scan line, are provided, and a plurality of pixel regions are provided in the display area where the scan line and the data line cross each other. In addition, a plurality of thin-film transistors (TFT) and a plurality of pixel electrodes electrically connected to a TFT of the plurality of TFTs are provided in the display area, and each of the plurality of pixel regions corresponds to a TFT of the plurality of TFTs and a pixel electrode of the plurality of pixel electrodes. In addition, an opposite electrode is provided in the display area commonly for the pixel regions. Various wires transmitting an electric signal to the display area, a scan driver, a data driver, and a controller may be provided in the non-display area.

The display apparatuses are being designed to have reduced thicknesses and light weights. Designs of a shape of the display area are being modified as a shape of the display apparatuses changes.

SUMMARY

According to an exemplary embodiment of the present invention, a display apparatus includes a substrate including a trench portion, a display area that displays an image, and a non-display area at least partially surrounding the display area. The non-display area includes a first non-display area. The display area includes a main area, a first display area, and a second display area. The first display area and the second display area protrude from a first side of the main area with the first non-display area disposed therebetween. The trench portion protrudes towards the display area and is provided between the first display area and the second display area. The display apparatus further includes: a plurality of first scan lines provided on the substrate, extending in a first direction, and transmitting scan signals to a plurality of pixels included in the first display area; a plurality of second scan lines transmitting scan signals to a plurality of pixels included in the second display area; a plurality of connection scan lines provided in the first non-display area and connecting the plurality of first scan lines and the plurality of second scan lines to each other; and a plurality of driving voltage lines extending in a second direction crossing the first direction and transmitting driving voltages to a plurality of pixels included in the main area. A plurality of first driving voltage lines among the plurality of driving voltage lines extend to the first non-display area, and overlap the plurality of connection scan lines with an insulating layer disposed therebetween.

In an exemplary embodiment of the present invention, the non-display area further includes a second non-display area provided adjacent to the main area. The plurality of driving voltage lines extend from a first power voltage line extending in the first direction along a second side of the main area in the second non-display area. At least one of the plurality of first driving voltage lines has a length different from that of other first driving voltage lines.

In an exemplary embodiment of the present invention, the numbers of the plurality of connection scan lines overlapping each of the plurality of first driving voltage lines are the same.

In an exemplary embodiment of the present invention, the plurality of connection scan lines are curved.

In an exemplary embodiment of the present invention, the plurality of connection scan lines includes a connection scan line adjacent to the trench portion and a connection scan line adjacent to the main area. The connection scan line adjacent to the trench portion is longer than the connection scan line adjacent to the main area.

In an exemplary embodiment of the present invention, the plurality of connection scan lines includes a connection scan line adjacent to the trench portion and a connection scan line adjacent to the main area. A width of the connection scan line adjacent to the trench portion is greater than a width of the connection scan line adjacent to the main area.

In an exemplary embodiment of the present invention, the plurality of connection scan lines, the plurality of first scan lines, and the plurality of second scan lines are provided on a same layer.

In an exemplary embodiment of the present invention, the display apparatus further includes a plurality of additional load layers provided in the first non-display area and overlapping the plurality of connection scan lines. The plurality of additional load layers are disposed on the substrate. The plurality of connection lines are disposed on the additional load layers, and the plurality of first driving voltage lines are disposed on the plurality of connection scan lines.

In an exemplary embodiment of the present invention, the numbers of the plurality of connection scan lines overlapping each of the plurality of additional load layers are the same.

In an exemplary embodiment of the present invention, each of the plurality of pixels included in the display area includes: a thin-film transistor including a semiconductor layer and a data line connected to the thin-film transistor. The plurality of additional load layers are provided on a same layer as the semiconductor layer, and the plurality of first driving voltage lines are provided on a same layer as the data line.

In an exemplary embodiment of the present invention, the plurality of additional load layers extend in the second direction and at least partially overlap the plurality of first driving voltage lines.

In an exemplary embodiment of the present invention, the plurality of additional load layers extend in the second direction and are spaced apart from each other.

In an exemplary embodiment of the present invention, the display apparatus further includes a plurality of connection wires crossing the plurality of first driving voltage lines. The plurality of connection wires connects the plurality of first driving voltage lines to each other.

In an exemplary embodiment of the present invention, the plurality of first driving voltage lines are covered by an inorganic protection layer.

According to an exemplary embodiment of the present invention, a display apparatus includes a substrate including a penetrating portion, a first non-display area provided adjacent to the penetrating portion, a first display area, and a second display area spaced apart from the first display area. The penetrating portion penetrates a top surface of the substrate and a bottom surface, opposite the top surface, of the substrate, and the first non-display area separates the first display area from the second display area. The display apparatus further includes: a plurality of first scan lines provided on the top surface of the substrate, extending in a first direction, and transmitting scan signals to a plurality of pixels included in the first display area; a plurality of second scan lines transmitting scan signals to a plurality of pixels included in the second display area; a plurality of connection scan lines provided in the first non-display area and connecting the plurality of first scan lines and the plurality of second scan lines to each other; and a plurality of first driving voltage lines overlapping the plurality of connection scan lines with an insulating layer disposed therebetween.

In an exemplary embodiment of the present invention, at least one of the plurality of first driving voltage lines has a length different from that of other first driving voltage lines, and the numbers of the plurality of connection scan lines overlapping each of the plurality of first driving voltage lines are the same.

In an exemplary embodiment of the present invention, at least one of the plurality of connection scan lines is curved.

In an exemplary embodiment of the present invention, the plurality of connection scan lines, the plurality of first scan lines, and the plurality of second scan lines are provided on a same layer.

In an exemplary embodiment of the present invention, the plurality of connection scan lines includes a first connection scan line and a second connection scan line, wherein the first connection scan line is adjacent to the penetrating portion, and the second connection scan line is farther from penetrating portion than the first connection scan line is. The first connection scan line is longer than the second connection scan line.

In an exemplary embodiment of the present invention, each of the plurality of pixels includes a pixel circuit including a thin-film transistor and a storage capacitor. Each of the plurality of pixels further includes an organic light-emitting diode electrically connected to the pixel circuit.

According to an exemplary embodiment of the present invention, a display apparatus includes a substrate including an indented region, a display area and a non-display area adjacent to the display area. The display area includes a main area, a first display area extending from the main area, and a second display area extending from the main area. The non-display area includes a first non-display area and a second non-display area. The indented region is disposed between the first display area and the second display area and in the first non-display area. The display apparatus further includes: a plurality of first scan lines disposed in the first display area and extending along a first direction; a plurality of second scan lines disposed in the second display area and extending along the first direction; a plurality of connection scan lines disposed in the first non-display area and connecting the plurality of first scan lines to the plurality of second scan lines; a plurality of driving voltage lines disposed in the display area and on the plurality of connection scan lines in the first non-display area. An insulating layer is disposed between the plurality of driving voltage lines and the plurality of connection scan lines in the first non-display area.

In an exemplary embodiment of the present invention, the plurality of driving voltage lines extend from the main area to the first non-display area and cross the plurality of connection scan lines in the first non-display area.

In an exemplary embodiment of the present invention, the plurality of driving voltage lines includes a first driving voltage line extending from the main area to the first display area and a second driving voltage line extending from the main area to the first non-display area, wherein the first driving voltage line has a length greater than that of the second driving voltage line.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
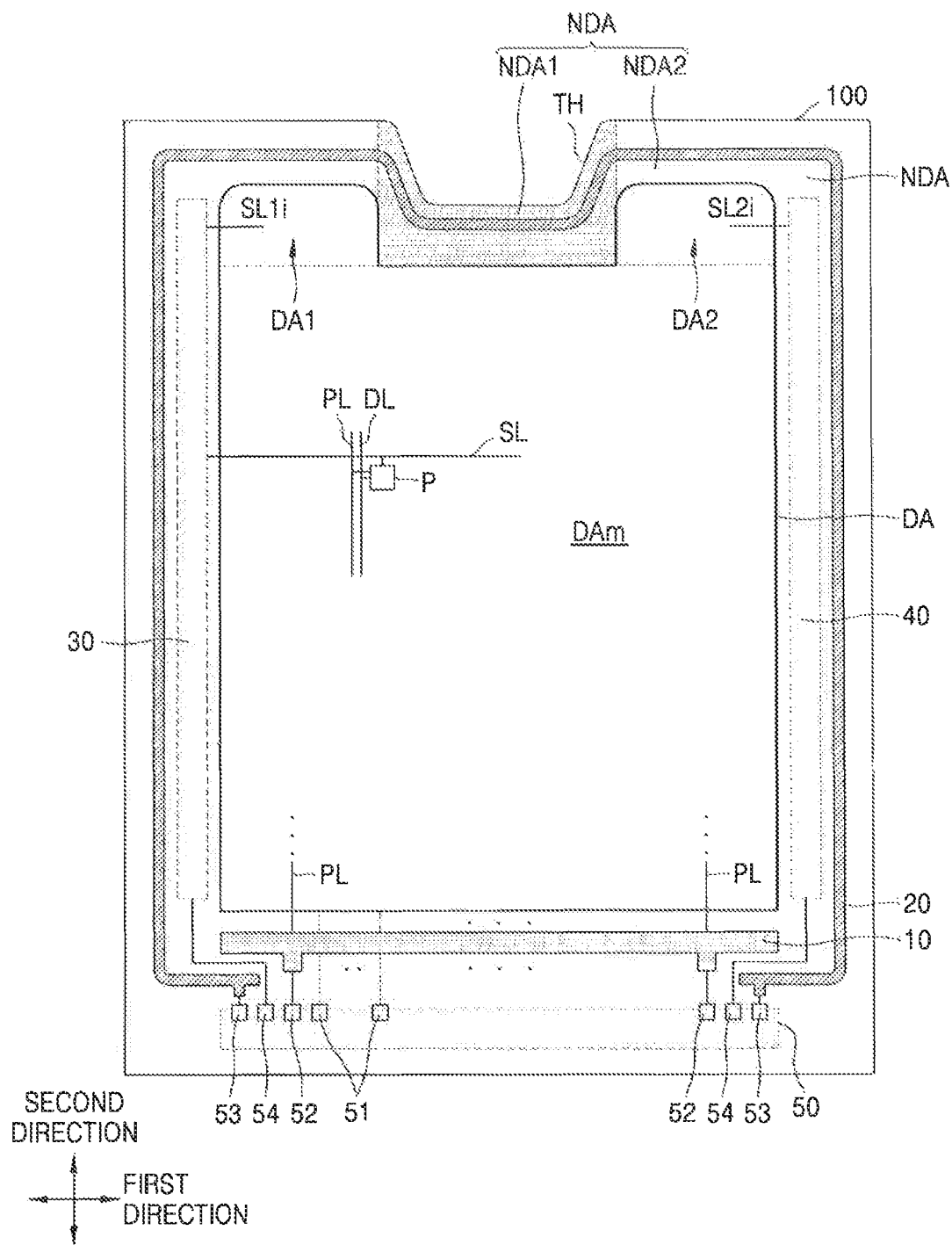
FIG. 1 is a plan view of a display apparatus according to an exemplary embodiment of the present invention.

Exemplary embodiments of the present invention will now be described more fully with reference to the accompanying drawings. It is to be understood that the present invention may be embodied in different forms and thus should not be construed as being limited to the exemplary embodiments set forth herein.

In drawings, like reference numerals may refer to like elements or features throughout the specification, and thus overlapping or repetitive descriptions may not be repeated.

It will be understood that when a layer, region, or component is referred to as being "on," another layer, region, or component, the layer, region, or component can be directly on the other layer, region, or component or intervening layers, regions, or components may be present.

In the drawings, sizes and thicknesses of elements and components may be exaggerated for clarity.

It will be understood that when a layer, region, or component is referred to as being "connected" or "coupled" to another layer, region, or component, the layers, regions or components may be directly connected or coupled to the other layer, region, or component or intervening layers, regions, or components may be present.

According to an exemplary embodiment of the present invention, a display apparatus is an apparatus displaying an image, and may be a liquid crystal display (LCD), an electrophoretic display, an organic light-emitting display, an inorganic light-emitting display, a field emission display, a surface-conduction electron-emitter display, a plasma display, or a cathode ray display.

Hereinafter, an organic light-emitting display is described as an example of a display apparatus according to an exemplary embodiment of the present invention, but the present invention is not limited thereto, and may be a different type of display apparatus.

FIG. 1 is a plan view of a display apparatus according to an exemplary embodiment of the present invention.

Referring to FIG. 1, a substrate 100 of the display apparatus includes, at one side, a trench portion TH protruding into the substrate 100. For example, the trench portion TH may be understood as a penetrating portion that is formed by penetrating top and bottom surfaces of the substrate 100. As an additional example, the trench portion TH may be an indent in a side of the substrate 100. The trench portion TH may have any shape. For example, the trench portion TH may have a U shape or a polygonal shape. A module, such as a camera, a speaker, or a sensor, may be provided in the trench portion TH.

The substrate 100 is divided into a display area DA and a non-display area NDA adjacent to the display area DA. For example, non-display area NDA may at least partially surround the display area DA. The display area DA may include a main area Dam, a first display area DA1, and a second display area DA2. The first display area DA1 and the second display area DA2 protrude from the main area DAm in a second direction and may be spaced apart from each other at a certain interval in a first direction. In other words, the first and second display areas DA1 and DA2 may be provided respectively at left and right sides of the trench portion TH or a first non-display area NDA1.

The non-display area NDA is an area surrounding an outer region of the display area DA and includes the first non-display area NDA1 and a second non-display area NDA2. The first non-display area NDA1 is an area adjacent to the trench portion TH and corresponds to an area provided between the first and second display areas DA1 and DA2. The second non-display area NDA2 corresponds to an area excluding the first non-display area NDA1. For example, the second non-display area NDA2 may be adjacent to the first non-display area NDA1 and may surround portions of the display area DA that are not surrounded by the first non-display area NDA1.

Pixels P connected to scan lines SL, first scan lines SL1$i$, and second scan lines SL2$i$ extending in the first direction, and data lines DL extending in the second direction crossing the first direction are provided in the display area DA. In addition, each pixel P is connected to a driving voltage line PL extending in the second direction.

Each pixel P may emit, for example, red, green, blue, or white light, and for example, may include an organic light-emitting diode. In addition, each pixel P may further include a device, such as a thin-film transistor (TFT), a storage capacitor, or the like. The display area DA provides an image through light emitted from the pixels P. The pixels P may be provided in an n×m matrix array, and n and m are real numbers greater than zero.

In the present specification, as described above, the pixel P may be a sub-pixel emitting red, green, blue, or white light.

The non-display area NDA is an area where the pixels P are not provided and does not provide an image. A first power voltage line 10 and a second power voltage line 20 applying different power voltages may be provided in the non-display area NDA. In addition, a first scan driver 30, a second scan driver 40, and a terminal unit 50 may be provided in the non-display area NDA.

The first power voltage line 10 may be provided to correspond to a bottom portion of the display area DA, e.g., a bottom portion of the main area DAm, in the second non-display area NDA2. The plurality of driving voltage lines PL transmitting a driving voltage to the plurality of pixels P arranged in the display area DA may be connected to the first power voltage line 10. In addition, the first power voltage line 10 may be connected to a first terminal 52 of the terminal unit 50.

The second power voltage line 20 may partially surround the display area DA in the first non-display area NDA1 and the second non-display area NDA2. The second power voltage line 20 provided in the first non-display area NDA1 may be curved according to a shape of the trench portion TH. The second power voltage line 20 may extend along sides of the display area DA, and may not completely extend along the same side of the display area DA that the first power voltage line 10 extends along. For example, the second power voltage line 20 may not overlap the first power voltage line 10 in the second direction. The second power voltage line 20 may be connected to a second terminal 53 of the terminal unit 50.

The first and second scan drivers 30 and 40 are provided in the second non-display area NDA2. The first and second drivers 30 and 40 may be provided at opposite sides of the main area DAm of the display area DA. For example, the first scan driver 30 may be provided to correspond to left sides of the main area DAm and the first display area DA1, and the second scan driver 40 may be provided to correspond to right sides of the main area DAm and the second display area DA2. A scan signal generated in the first scan driver 30 may be provided to some pixels P through the first scan lines SL1$i$, wherein i is a value from 1 to n, and a scan signal generated in the second scan driver 40 may be provided to some pixels P through the second scan lines SL2$i$.

The first and second scan drivers 30 and 40 are provided on two sides of the display area DA and may perform dual-scanning. For example, the first scan driver 30 may generate and transmit a scan signal to some pixels P among the pixels P provided in the display area DA, and the second scan driver 40 may generate and transmit a scan signal to remaining pixels P among the pixels P provided in the display area DA. The first and second scan drivers 30 and 40 may be synchronized by a synchronized clock signal.

According to an exemplary embodiment of the present invention, the pixels P provided in the first display area DA1 may receive the scan signal generated in the first scan driver 30, and the pixels P provided in the second display area DA2 may receive the scan signal generated in the second scan driver 40. However, the current embodiment is not limited thereto. According to an exemplary embodiment of the present invention, one of the first and second scan drivers 30 and 40 may not be provided.

The terminal unit 50 is provided in the second non-display area NDA2 and includes a plurality of terminals, e.g., a terminal 51, the second and third terminals 53 and 54. The terminal unit 50 may be exposed by not being covered by an insulating layer and may be electrically connected to a controller, such as a flexible printed circuit board (PCB) or a driving integrated circuit (IC) chip. The controller changes a plurality of image signals transmitted from an external source to a plurality of image data signals and transmits the image data signals to the display area DA through the terminal 51. In addition, the controller may generate control signals for controlling driving of the first and second scan drivers 30 and 40 upon receiving a vertical synchronization signal, a horizontal synchronization signal, and a clock signal, and transmit the control signals through the third terminal 54. The controller may transmit different voltages to the first and second power voltage lines 10 and 20 through the first and second terminals 52 and 53.

The first power voltage line 10 may provide a first power voltage ELVDD to each pixel P, and the second power voltage line 20 may provide a second power voltage ELVSS to each pixel P. For example, the first power voltage ELVDD may be provided to each pixel P through the driving voltage line PL connected to the first power voltage line 10. The second power voltage ELVSS may reach a cathode of an organic light-emitting diode included in each pixel P, in the non-display area NDA.

Figure 2A:
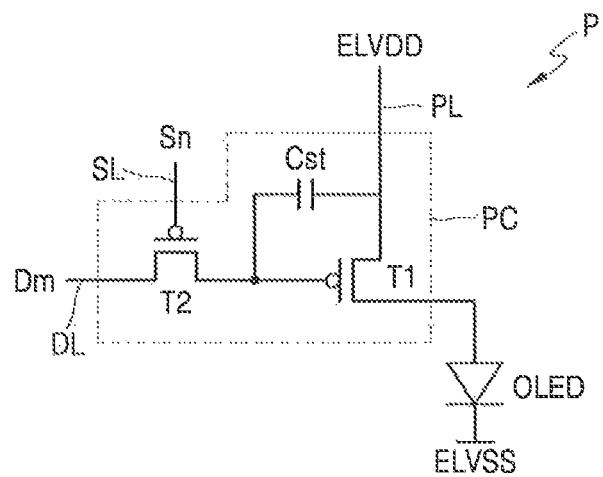
FIGS. 2A and 2b are circuit diagrams of one pixel of a display apparatus, according to an exemplary embodiment of the present invention.
Figure 2B:
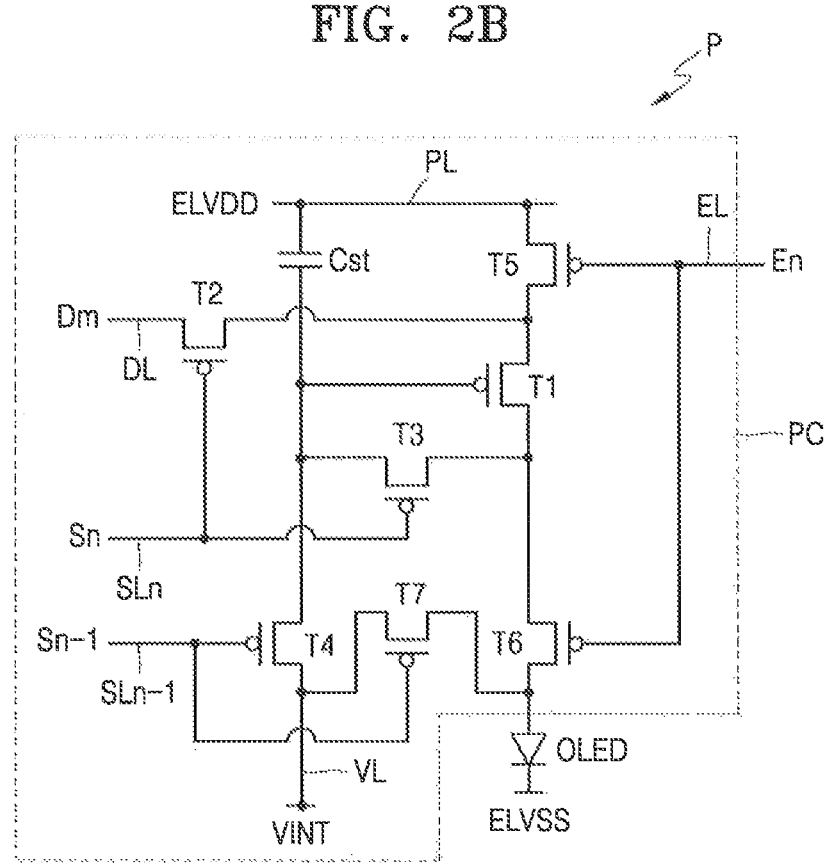

FIGS. 2A and 2B are circuit diagrams of one pixel P of a display apparatus, according to an exemplary embodiment of the present invention.

Referring to FIG. 2A, each pixel P includes a pixel circuit PC connected to the scan line SL and the data line DL, and an organic light-emitting diode OLED connected to the pixel circuit PC.

The pixel circuit PC includes a driving TFT T1, a switching TFT T2, and a storage capacitor Cst. The switching TFT T2 is connected to the scan line SL and the data line DL, and transmits a data signal Dm received through the data line DL to the driving TFT T1 according to a first scan signal Sn received through the scan line SL.

The storage capacitor Cst is connected to the switching TFT T2 and the driving voltage line PL and stores a voltage corresponding to a difference between a voltage received from the switching TFT T2 and the first power voltage ELVDD (or a driving voltage) supplied to the driving voltage line PL.

The driving TFT T1 is connected to the driving voltage line PL, the switching TFT T2, and the storage capacitor Cst and may control a driving current flowing from the driving voltage line PL to the organic light-emitting diode OLED according to a value of a voltage stored in the storage capacitor Cst. The organic light-emitting diode OLED may emit light having certain luminance according to the driving current.

In FIG. 2A, the pixel circuit PC includes two TFTs and one storage capacitor, but the present invention is not limited thereto.

Referring to FIG. 2B, the pixel circuit PC may include driving and switching TFTs T1 and T2, a compensation TFT T3, a first initialization TFT T4, a first emission control TFT T5, a second emission control TFT T6, and a second initialization TFT T7.

In FIG. 2B, signal lines (a scan line SLn, a previous scan line SLn-1, an emission control line EL, and the data line DL), an initialization voltage line VL, and the driving voltage line PL are provided in each pixel P, but an the present invention is not limited thereto. According to an exemplary embodiment of the present invention, at least one of the signal lines and/or the initialization voltage line VL may be shared between neighboring pixels P.

A drain electrode of the driving TFT T1 may be electrically connected to the organic light-emitting diode OLED through the second emission control TFT T6. The driving TFT T1 supplies a driving current to the organic light-emitting diode OLED by receiving the data signal Dm according to a switching operation of the switching TFT T2.

A gate electrode of the switching TFT T2 is connected to the scan line SL, and a source electrode of the switching TFT T2 is connected to the data line DL. A drain electrode of the switching TFT T2 may be connected to a source electrode of the driving TFT T1 while being connected to the driving voltage line PL through the first emission control TFT T5.

The switching TFT T2 is turned on according to the first scan signal Sn received through the scan line SL, and performs a switching operation in which the data signal Dm transmitted to the data line DL is transmitted to the source electrode of the driving TFT T1.

A gate electrode of the compensation TFT T3 may be connected to the scan line SLn. A source electrode of the compensation TFT T3 is connected to the drain electrode of the driving TFT T1 while being connected to a pixel electrode of the organic light-emitting diode OLED through the second emission control TFT T6. A drain electrode of the compensation TFT T3 may be connected together with any one of the electrodes of the storage capacitor Cst, a source electrode of the first initialization TFT T4, and the gate electrode of the driving TFT T1. The compensation TFT T3 may be turned on according to the first scan signal Sn received through the scan line SL, and the organic light-emitting diode OLED connects to the driving TFT T1 by connecting the gate electrode and the drain electrode of the driving TFT T1 to each other.

A gate electrode of the first initialization TFT T4 may be connected to the previous scan line SLn-1. A drain electrode of the first initialization TFT T4 may be connected to the initialization voltage line VL. The source electrode of the first initialization TFT T4 may be connected together with any one of the electrodes of the storage capacitor Cst, the drain electrode of the compensation TFT T3, and the gate electrode of the driving TFT T1. The first initialization TFT T4 is turned on according to a second scan signal Sn-1 received through the previous scan line SLn-1 and may perform an initialization operation in which a voltage of the gate electrode of the driving TFT T1 is initialized by transmitting an initialization voltage VINT to the gate electrode of the driving TFT T1.

A gate electrode of the first emission control TFT T5 may be connected to the emission control line EL A source electrode of the first emission control TFT T5 may be connected to the driving voltage line PL A drain electrode of the first emission control TFT T5 may be connected to the source electrode of the driving TFT T1 and the drain electrode of the switching TFT T2.

A gate electrode of the second emission control TFT T6 may be connected to the emission control line EL. A source electrode of the second emission control TFT T6 may be connected to the drain electrode of the driving TFT T1 and the source electrode of the compensation TFT T3. A drain electrode of the second emission control TFT T6 may be electrically connected to the pixel electrode of the organic light-emitting diode OLED. The first and second emission control TFTs T5 and T6 are simultaneously turned on according to an emission control signal En received through the emission control line EL, and thus, the first power voltage ELVDD is transmitted to the organic light-emitting diode OLED and a driving current flows through the organic light-emitting diode OLED.

A gate electrode of the second initialization TFT T7 may be connected to the previous scan line SLn-1. A source electrode of the second initialization TFT T7 may be connected to the pixel electrode of the organic light-emitting diode OLED. A drain electrode of the second initialization TFT T7 may be connected to the initialization voltage line VL. The second initialization TFT T7 is turned on according to the second scan signal Sn-1 received through the previous scan line SLn-1 to initialize the pixel electrode of the organic light-emitting diode OLED.

In FIG. 2B, the first and second initialization TFTs T4 and T7 are connected to the previous scan line SLn-1, but the present invention is not limited thereto. According to an exemplary embodiment of the present invention, the first initialization TFT T4 may be driven according to the second scan signal Sn-1 by being connected to the previous scan line SLn-1, and the second initialization TFT T7 may be driven according to a signal transmitted to a corresponding scan line by being connected to a separate signal line (for example, a subsequent scan line).

The other electrode of the storage capacitor Cst may be connected to the driving voltage line PL. Any one of the electrodes of the storage capacitor Cst may also be connected to the gate electrode of the driving TFT T1, the drain electrode of the compensation TFT T3, and the source electrode of the first initialization TFT T4.

An opposite electrode (for example, a cathode) of the organic light-emitting diode OLED receives the second power voltage ELVSS (or, e.g., a common power voltage). The organic light-emitting diode OLED emits light by receiving a driving current from the driving TFT T1.

The pixel circuit PC is not limited to a circuit design or the numbers of TFTs and storage capacitors described above with reference to FIGS. 2A and 2B, and the circuit design and the number of TFTs and storage capacitors Cst may vary.

Hereinafter, a display apparatus according to an exemplary embodiment of the present invention will be described with reference to FIGS. 3 through 5.

Figure 3:
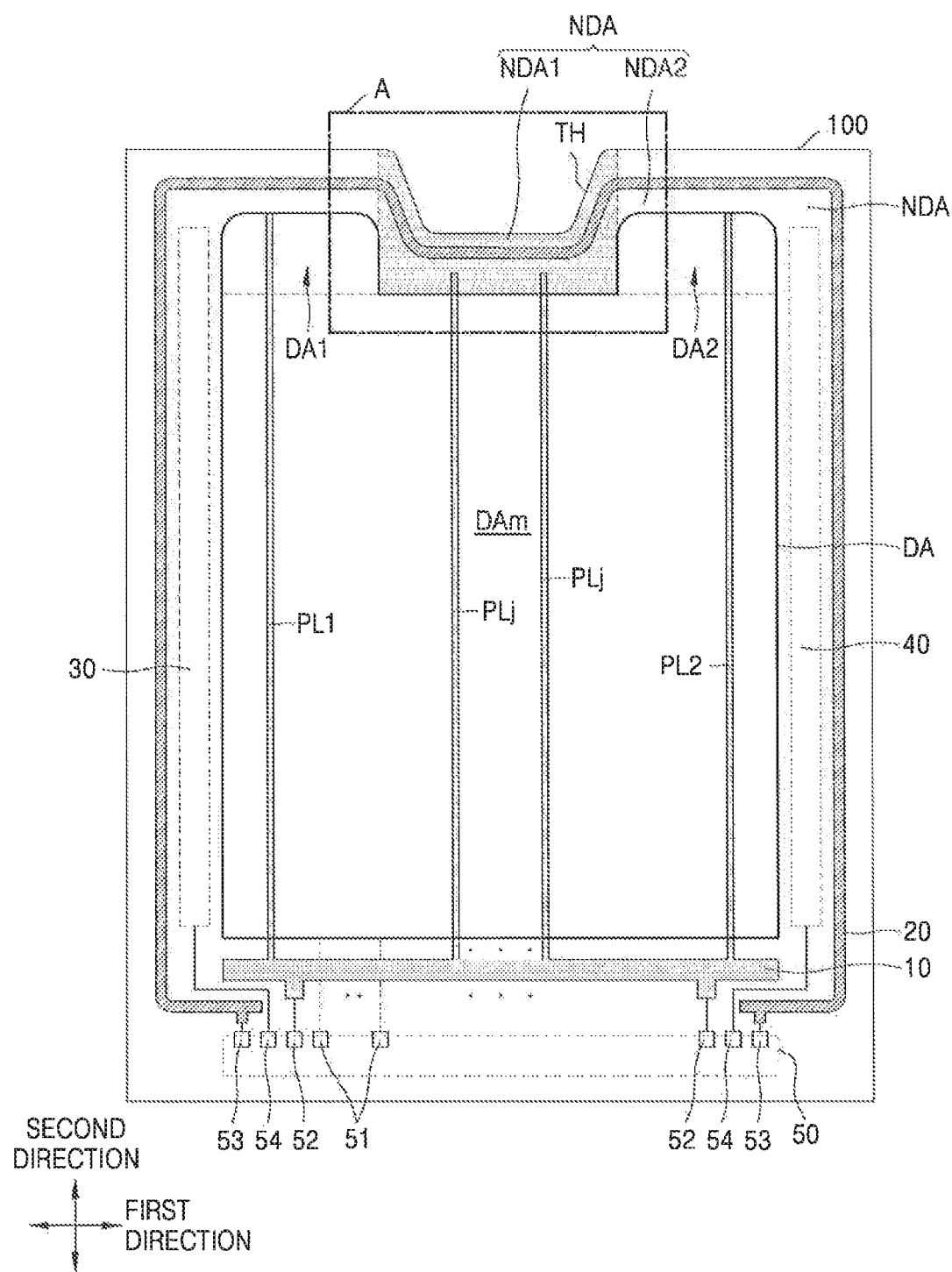
FIG. 3 is a plan view of a display apparatus according to an exemplary embodiment of the present invention.
Figure 4:
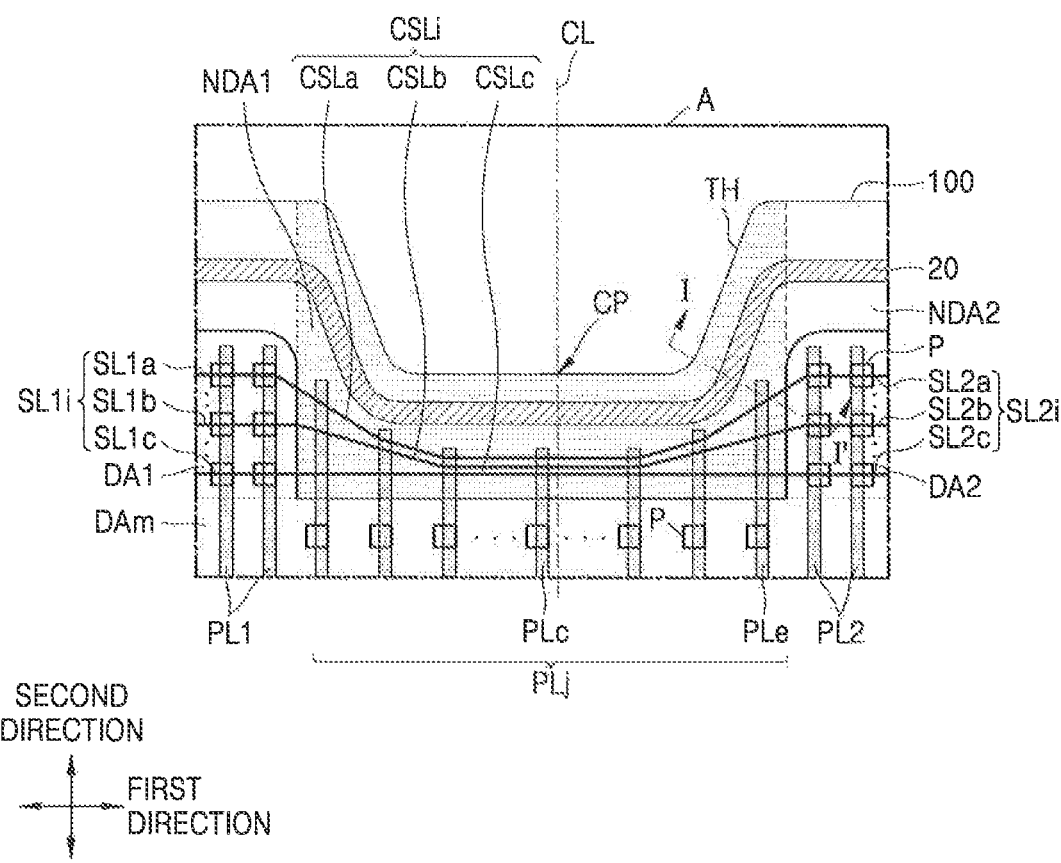
FIG. 4 is an enlarged view of a region A of FIG. 3 according to an exemplary embodiment of the present invention.

FIG. 3 is a plan view of a display apparatus according to an exemplary embodiment of the present invention, and FIG. 4 is an enlarged view of a region A of FIG. 3 according to an exemplary embodiment of the present invention.

Referring to FIG. 3, the display area DA includes the first and second display areas DA1 and DA2 that are spaced apart from each other with the trench portion TH therebetween, and thus, lengths of a plurality of driving voltage lines PL1, PLj, and PL2 extending from the first power voltage line 10 in the second direction may vary according to a location of the driving voltage line PL. In other words, the lengths of the driving voltage lines PL1 and PL2 extending to the first and second display areas DA1 and DA2 from the first power line 10 may be longer than the length of the driving voltage line PLj extending to a region between the first and second display areas DA1 and DA2, e.g., to the first non-display area NDA1, from the first power line 10. For example, the driving voltage line PLj may have a shorter length than that of the driving voltage lines PL1 and PL2 because the driving voltage line PLj extends from the first power line 10 to the trench TH.

In a display apparatus according to a comparative example having a display area of a rectangular shape, lengths of wires (for example, scan lines) extending in a first direction and lengths of wires (for example, data lines and/or driving voltage lines) extending in a second direction, e.g., crossing the first direction, are uniform, and thus, values of parasitic capacitance generated per pixel are uniform.

However, in the current embodiment, the first and second display areas DA1 and DA2 are provided, and thus lengths of wires extending in the first direction or the second direction may vary according to locations. Accordingly, parasitic capacitance or load generated in the first and second display areas DA1 and DA2 may be different from that in the main area DAm of the display area DA. Due to such a difference in the parasitic capacitance or load, luminance deviation may occur between the main area DAm and the first display area DA1 or between the first display area DA1 and the second display area DA2.

Referring to FIG. 4, in the current embodiment, connection scan lines CSLi provided in the first non-display area NDA1, in which i is a value from 1 to n (n is a real number greater than 1), and driving voltage lines PLj overlapping the connection scan lines CSLi, in which j is a value from 1 to m (m may be a real number greater than 1), are provided to adjust the parasitic capacitance or load of the first and second display areas DA1 and DA2.

The first display area DA1 includes the plurality of first scan lines SL1$i$ providing scan signals respectively to the plurality of pixels P, in which i is a value from 1 to n, in which n is a natural number, and the second display area DA2 includes the plurality of second scan lines SL2$i$ providing scan signals respectively to the pixels P. The first scan lines SL1$i$ may transmit a scan signal generated by the first scan driver 30, and the second scan line SL2$i$ may transmit a scan signal generated by the second scan driver 40.

In other words, when the first and second scan drivers 30 and 40 are provided on two sides of the display area DA, the pixels P of the first display area DA1 may receive the scan signals through the first scan lines SL1$i$, and the pixels P of the second display area DA2 may receive the scan signals through the second scan line SL2$i$, and thus, the display apparatus may be driven without the first and second lines SL1$i$ and SL2$i$ being connected to each other.

In addition, in the current embodiment, the plurality of first scan lines SL1$i$ and the plurality of second scan lines SL2$i$ are connected to each other by the plurality of connection scan lines CSLI. For example, a first scan line SL1$a$ in an at row is connected to a second scan line SL2$a$ in the $a^{th}$ row by a connection scan line CSLa in the $a^{th}$ row, and a second scan line SL1$b$ in a $b^{th}$ row is connected to a second scan line SL2$b$ in the b row by a connection scan line CSLb in the $b^{th}$ row. The plurality of connection scan lines CSLi are provided in the first non-display area NDA1, and may be curved or bent according to the shape of the trench portion TH. The plurality of connection scan lines CSLi may be arranged on a same layer as the plurality of first scan lines SL1$i$ and the plurality of second scan lines SL2$i$. However, the present invention is not limited thereto. For example, the plurality of connection scan lines CSLi may be arranged on a different layer from that of the plurality of first scan lines SL1$i$ and the plurality of second scan lines SL2$i$ and connected to the plurality of first scan lines SL1$i$ and the plurality of second scan lines SL2$i$ each through a through hole.

Such a connection scan line CSLi not only transmits a scan signal, but also adjusts the load of the first and second display areas DA1 and DA2.

In addition, to adjust the load of the first and second display areas DA1 and DA2, the plurality of driving voltage lines PLj extending in the second direction overlap on the plurality of connection scan lines CSLi with an insulating layer disposed therebetween. Accordingly, node capacitor Cn (see, e.g., FIG. 5) may be formed from the plurality of connection scan lines CSLi and the driving voltage lines PLj.

Lengths of the driving voltage lines PLj provided in the first non-display area NDA1 and arranged along the first direction may vary according to the shape of the trench portion TH. For example, when the trench portion TH has a U-shape, the lengths of the driving voltage lines PLj may gradually increase from a center portion CP or a center line CL towards edges of the trench portion TH. For example, the length of the driving voltage lines PLj may gradually increase as their distance from the center line CL or center portion CP increases in the first direction. For example, the center portion CP or the center line CL may correspond to a portion of the trench TH with the largest indent into the substrate 100. Here, the numbers of plurality of connection scan lines CSLi overlapping each of the driving voltage lines PLj may be the same. In other words, the number of connection scan lines CSLi overlapping a driving voltage line PLc arranged near the center portion CP or the center line CL may be the same as the number of connection scan lines CSLi overlapping a driving voltage line PLe arranged near the edges of the trench portion TH.

The driving voltage line PLc may be arranged on a same layer as the second power voltage line 20. In this case, an end portion of the driving voltage line PLj may be spaced apart from the second power voltage line 20.

In addition, the driving voltage lines PL1 and PL2 provided in the first and second display areas DA1 and DA2 may not extend up to the non-display area NDA, but may be provided only in the first and second display areas DA1 and DA2.

Figure 5:
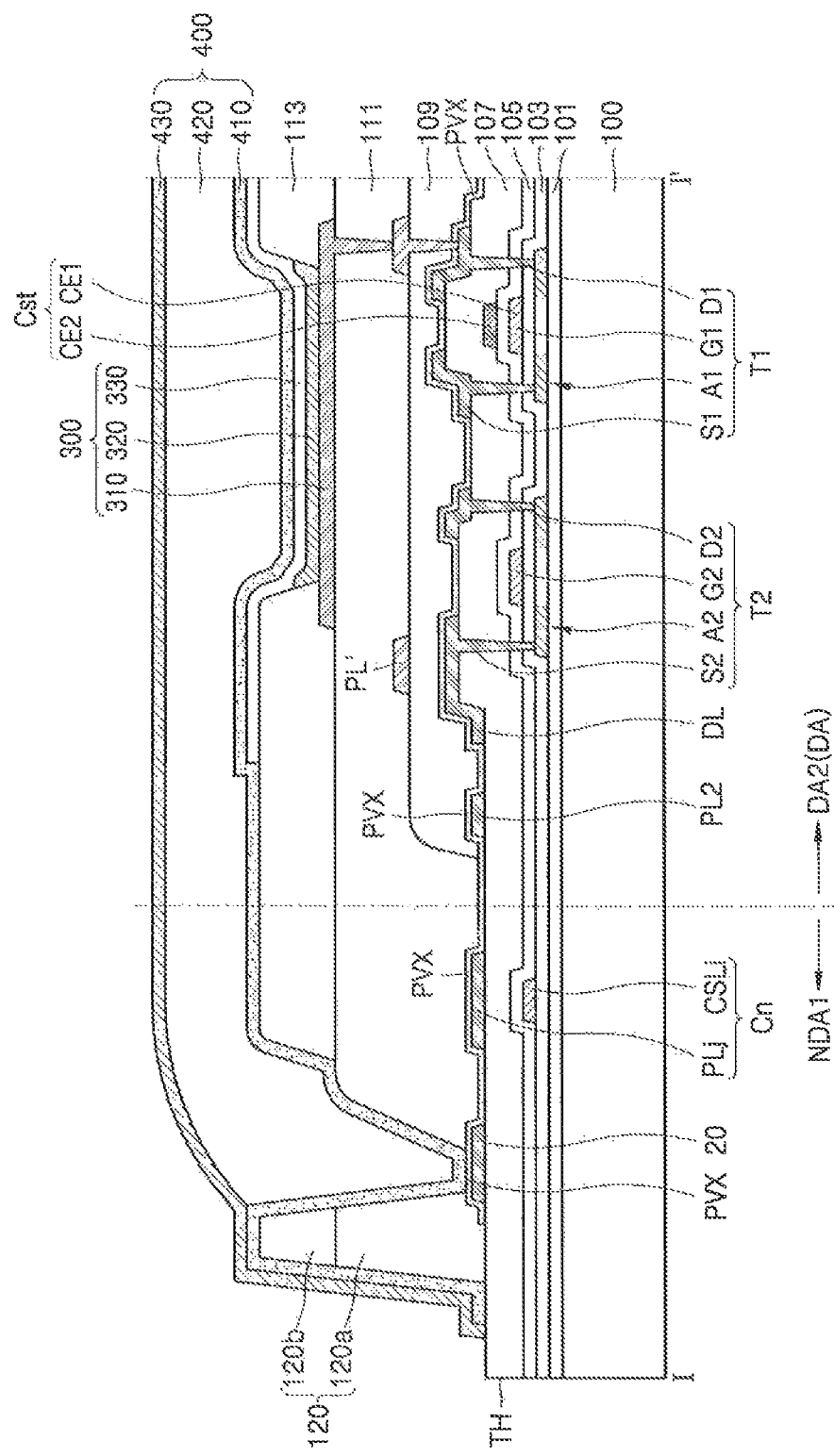
FIG. 5 is a cross-sectional view taken along a line I-I' of FIG. 4 according to an exemplary embodiment of the present invention.

FIG. 5 is a cross-sectional view taken along a line I-I' of FIG. 4 according to an exemplary embodiment of the present invention. FIG. 5 illustrates the driving and switching TFTs T1 and T2 and the storage capacitor Cst among the pixel circuit PC of each pixel P described above with reference to FIGS. 2A and 2B according to an exemplary embodiment of the present invention. For convenience of description, elements or layers of FIG. 5 are described in an order in which they may be stacked.

Referring to FIG. 5, the pixel P is provided in the display area DA, and the node capacitor Cn is formed as the connection scan line CSLi and the driving voltage line PLj overlap each other in the first non-display area NDA1.

First, referring to the display area DA, a buffer layer 101 is provided on the substrate 100, and the driving and switching TFTs T1 and T2 and the storage capacitor Cst are provided on the buffer layer 101.

The substrate 100 may include any one of various materials, for example, a glass material and a plastic material such as polyethylene terephthalate (PET), polyethylene naphthalate (PEN), and polyimide. The substrate 100 may be more flexible when the substrate 100 includes a plastic material than when the substrate 100 includes a glass material. The buffer layer 101 formed of, for example, silicon oxide (SiOx) and/or silicon nitride (SiNx) may be provided on the substrate 100 to prevent impurities from penetrating elements and components of the display apparatus.

The driving TFT T1 includes a driving semiconductor layer A1 and a driving gate electrode G1, and the switching TFT T2 includes a switching semiconductor layer A2 and a switching gate electrode G2. A first gate insulating layer 103 is provided between the driving semiconductor layer A1 and the driving gate electrode G1 and between the switching semiconductor layer A2 and the switching gate electrode G2. The first gate insulating layer 103 may include an inorganic insulating material, such as silicon oxide (SiOx), silicon nitride (SiNx), or silicon oxynitride (SiON).

The driving semiconductor layer A1 and the switching semiconductor layer A2 may include polysilicon. The driving semiconductor layer A1 includes a driving channel region overlapping the driving gate electrode G1 and is not doped with an impurity, and driving source and drain regions provided on two sides of the driving channel region and are doped with an impurity. A driving source electrode S1 and a driving drain electrode D1 may be respectively connected to the driving source region and the driving drain region.

The switching semiconductor layer A2 may include a switching channel region overlapping the switching gate electrode G2 and is not doped with an impurity, and switching source and drain regions provided on two sides of the switching channel region and are doped with an impurity. A switching source electrode S2 and a switching drain electrode D2 may be respectively connected to the switching source region and the switching drain region.

The driving and switching gate electrodes G1 and G2 may include, for example, molybdenum (Mo), aluminum (Al), copper (Cu), and/or titanium (Ti), and may include a single layer or multiple layers. For example, the driving and switching gate electrodes G1 and G2 may be a single layer of Mo.

According to an exemplary embodiment of the present invention, the storage capacitor Cst may overlap the driving TFT T1. In this case, areas of the storage capacitor Cst and the driving TFT T1 may be increased, and a high-quality image may be provided. For example, the driving gate electrode G1 may be a first storage capacitor plate CE1. A second storage capacitor plate CE2 may overlap the first storage capacitor plate CE1 with a second gate insulating layer 105 disposed therebetween. The second gate insulating layer 105 may include, for example, an inorganic insulating material, such as silicon oxide (SiOx), silicon nitride (SiNx), and/or silicon oxynitride (SiON).

The driving and switching TFTs T1 and T2 and the storage capacitor Cst may be covered by an interlayer insulating layer 107. The interlayer insulating layer 107 may be an inorganic material layer including, for example, silicon oxide (SiOx), silicon nitride (SiNx), and/or silicon oxynitride (SiON). The data line DL and the driving voltage line PL2 may be provided on the interlayer insulating layer 107. The data line DL reaches the switching semiconductor layer A2 of the switching TFT T2 through a contact hole penetrating the interlayer insulating layer 107, the second gate insulating layer 105 and the first gate insulating layer 103. The data line DL may function as the switching source electrode S2. For example, the data line DL and the switching source electrode S2 may be formed together. In addition, the driving source electrode S1, the driving drain electrode D1, the switching source electrode S2, and the switching drain electrode D2 may be provided on the interlayer insulating layer 107, and may reach the driving semiconductor layer A1 or the switching semiconductor layer A2 through a contact hole penetrating the intertayer insulating layer 107. For example, the driving source electrode S1 and the driving drain electrode D1 may reach the driving semiconductor layer A1, and the switching source electrode S2 and the switching drain electrode D2 may reach the switching semiconductor layer A2.

The driving voltage line PL2, the data line DL, the driving source electrode S1, the driving drain electrode D1, the switching source electrode S2, and the switching drain electrode D2 may be covered by an inorganic protection layer PVX.

The inorganic protection layer PVX may be a single layer or multilayer of, for example, silicon nitride (SiNx) and/or silicon oxide (SiOx). The inorganic protection layer PVX may cover and protect some wires exposed in the non-display area NDA. Wires formed during a same process as the data line DL or the driving voltage line PL2 may be exposed in a partial region (for example, a part of the non-display area NDA) of the substrate 100. The exposed wires may be damaged by an etchant used to pattern a pixel electrode 310 described later, but since the inorganic protection layer PVX protects the data line DL and at least some of the wires formed together with the data line DL in the current embodiment, the wires may be prevented from being damaged during a patterning process of the pixel electrode 310.

In addition, the inorganic protection layer PVX may be formed via any one of various deposition methods, such as a sputtering process, a chemical vapor deposition (CVD) process, and a plasma-enhanced chemical vapor deposition (PECVD) process. When such a deposition method is used, the data line DL and the driving voltage line PL2, which are metal wires, may be damaged by static electricity or plasma because the data line DL and the driving voltage line PL2 are exposed.

In the current embodiment, nodes of the first display area DA1, the second display area DA2, and the main area DAm are uniformly adjusted by employing the node capacitor Cn, and thus, the damage caused by static electricity or plasma may be prevented.

A via layer 109 and an organic insulating layer 111 may be planarization insulating layers, and may include an organic material. Examples of the organic material include a polymer, such as imide-based polymer, polymethylmethacrylate (PMMA), and polystyrene (PS), polymer derivatives having a phenol-based group, acryl-based polymer, aryl ether-based polymer, amide-based polymer, fluorine-based polymer, p-xylene-based polymer, vinyl alcohol-based polymer, and a blend thereof. The via layer 109 may include an organic material, and materials thereof are as described above. In addition, the via layer 109 may include an inorganic material, such as silicon oxynitride (SiON), silicon oxide (SiOx), and/or silicon nitride (SiNx).

An additional driving voltage line PL' may be provided on the via layer 109. For example, the additional driving voltage line PL' may be provided above the via layer 109. The additional driving voltage line PL' may be a single layer or a multilayer structure including at least one of, for example, aluminum (Al), copper (Cu), titanium (Ti), and an alloy thereof. According to an exemplary embodiment of the present invention, the additional driving voltage line PL' may be, for example, a triple layer of Ti/Al/Ti. The additional driving voltage line PL' may reduce resistance by being connected to the driving voltage line PL2 through a through hole formed in the via layer 109.

The organic light-emitting diode OLED including the pixel electrode 310, an opposite electrode 330, and an intermediate layer 320 that is disposed therebetween and includes an emission layer may be provided on the organic insulating layer 111.

A pixel-defining layer 113 may be provided on the pixel electrode 310. The pixel-defining layer 113 may have an opening exposing the pixel electrode 310. In addition, the pixel-defining layer 113 increases a distance between an edge of the pixel electrode 310 and the opposite electrode 330, thereby preventing generation of an arc therebetween. The pixel-defining layer 113 may be formed of, for example, an organic material such as polyimide or hexamethyldisiloxane (HMDSO).

The intermediate layer 320 may include a low molecular weight material or a high molecular weight material. When the intermediate layer 320 includes a low molecular weight material, the intermediate layer 320 may have a structure in which a hole injection layer (HIL), a hole transport layer (HTL), an emission layer (EML), an electron transport layer (ETL), and an electron injection layer (EIL) are stacked in a single or complex structure, and may include various organic materials, such as copper phthalocyanine (CuPc), N,N'-Di(naphthalene-1-yl)-N,N'-diphenyl-benzidine (NPB), and tris-8-hydroxyquinoline aluminum (Alq3). Such layers may be formed via a vacuum deposition method.

When the intermediate layer 320 includes a high molecular weight material, the intermediate layer 320 may have a structure including an HTL and an EML. The HTL may include PEDOT and the EML may include a high molecular weight material, such as poly-phenylenevinylene (PPV)-based or polyfluorene-based material. A structure of the intermediate layer 320 is not limited thereto, and may vary. For example, the intermediate layer 320 may include one single layer throughout the plurality of pixel electrodes 310, or individual layers patterned to respectively correspond to the plurality of pixel electrodes 310.

The opposite electrode 330 is provided over the display area DA to at least partially cover the display area DA. In other words, the opposite electrode 330 may be integrally formed throughout the plurality of organic light-emitting diodes OLED to correspond to the plurality of pixel electrodes 310. For example, the opposite electrode 330 may be single structure.

Since the organic light-emitting diode OLED may be easily damaged by external moisture or oxygen, the organic light-emitting diode OLED may be covered and protected by a thin encapsulation layer 400. The thin encapsulation layer 400 may extend up to the display area DA while covering the display area DA. The thin encapsulation layer 400 includes, for example, at least one organic encapsulation layer and at least one inorganic encapsulation layer. For example, the thin encapsulation layer 400 may include a first inorganic encapsulation layer 410, an organic encapsulation layer 420, and a second inorganic encapsulation layer 430.

The first inorganic encapsulation layer 410 covers the opposite electrode 330, and may include, for example, silicon oxide, silicon nitride, and/or silicon oxynitride. Although not illustrated, another layer, such as a capping layer, may be disposed between the first inorganic encapsulation layer 410 and the opposite electrode 330. Since the first inorganic encapsulation layer 410 is formed on an organic light emitting diode 300 and layers therebelow, a top surface of the first inorganic encapsulation layer 410 may not be flat. For example, the top surface of the first inorganic encapsulation layer 410 may be uneven. The organic encapsulation layer 420 covers the first inorganic encapsulation layer 410, and may have a flat top surface unlike the first inorganic encapsulation layer 410. For example, the organic encapsulation layer 420 may have a flat top surface at a region corresponding to the display area DA. The organic encapsulation layer 420 may include at least one of, for example, PET, PEN, polycarbonate, polyimide, polyethylene sulfonate, polyoxymethylene, polyarylate, and HMDSO. The second inorganic encapsulation layer 430 covers the organic encapsulation layer 420, and may include, for example, silicon oxide, silicon nitride, and/or silicon oxynitride.

Even when a crack is generated in the thin encapsulation layer 400, the crack may not spread between the first inorganic encapsulation layer 410 and the organic encapsulation layer 420 or between the organic encapsulation layer 420 and the second inorganic encapsulation layer 430 according to the multilayer structure of the thin encapsulation layer 400. Accordingly, formation of a path through which external moisture or oxygen may penetrate into the display area DA may be prevented or reduced. Although not illustrated, a polarizing plate may be provided on the thin encapsulation layer 400 and may be a transparent adhesive. The polarizing plate has a structure that may reduce external light reflection, and a layer including a black matrix and a color filter may be used instead of the polarizing plate.

The connection scan line CSLi provided in the first non-display area NDA1 may be provided on a same layer as the driving and switching gate electrodes G1 and G2. In other words, the connection scan line CSLi may be provided on the first gate insulating layer 103. For example, the connection scan line CSLi may be disposed above the first gate insulating layer 103. In addition, the driving voltage line PLj provided in the first non-display area NDA1 may be provided on a same layer as the driving voltage line PL and the data line DL of the display area DA. The driving voltage line PLj may be provided on the interlayer insulating layer 107. The driving voltage line PLj may be disposed above the interlayer insulating layer 107. Accordingly, the second gate insulating layer 105 and the interlayer insulating layer 107 may be provided between the driving voltage line PLj and the connection scan line CSLi. The driving voltage line PLj may be protected by the inorganic protection layer PVX.

The second power voltage line 20 is provided on the interlayer insulating layer 107 and is spaced apart from the driving voltage line PLj. The second power voltage line 20 may be connected to the opposite electrode 330 of the organic light-emitting diode 300 to transmit the second power voltage ELVSS.

A dam portion 120 may be formed in the first non-display area NDA1. The dam portion 120 is spaced apart from the organic insulating layer 111, and the inorganic protection layer PVX may be provided in a region where the dam portion 120 and the organic insulating layer 111 are spaced apart. For example, a portion of the inorganic protection layer PVX may be disposed between the dam portion 120 and the organic insulating layer 111. In addition, the dam portion 120 may cover an end portion of the second power voltage line 20.

The organic insulating layer 111 may be formed of an organic material, and when the organic insulating layer 111 is connected to the dam portion 120 that is also formed of an organic material, the organic insulating layer 111 may be vulnerable to penetration of external air or moisture. In the current embodiment, the organic insulating layer 111 and the dam portion 120 is spaced apart from each other with the inorganic protection layer PVX therebetween, and thus, penetration of external air or moisture into the display area DA may be prevented.

The dam portion 120 may include a plurality of dams spaced apart from each other. The dam portion 120 is spaced apart from the organic insulating layer 111 and the pixel-defining layer 113, and may prevent an organic material from transferring to an edge of the substrate 100 while the organic encapsulation layer 420 of the thin encapsulation layer 400 is formed. When there is a plurality of dam portions 120, the dam portions 120 may be spaced apart from each other.

The dam portion 120 may have a single layer structure or a multilayer structure. As illustrated, the dam portion 120 may have a structure in which a first layer 120a and a second layer 120b are stacked on each other. In this case, the first layer 120a may be formed of a same material and at the same time as the pixel-defining layer 113.

However, the current embodiment is not limited thereto. A structure of the dam portion 120 may vary, for example, may be a single layer structure or at least a three layered structure.

The first and second inorganic encapsulation layers 410 and 430 of the thin encapsulation layer 400 may not directly contact each other outside the dam portion 120, and thus the organic encapsulation layer 420 may not be externally exposed. In other words, penetration of external air or moisture due to an organic material may be prevented.

Figure 6:
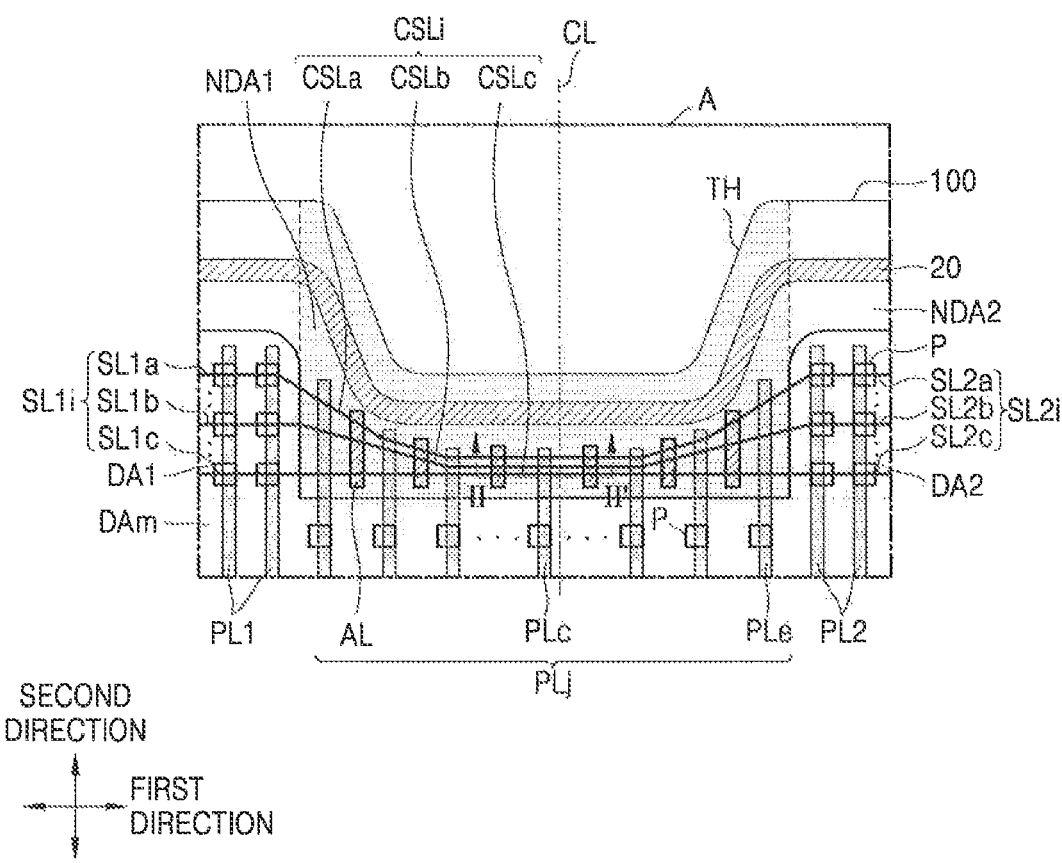
FIG. 6 is a plan view of a part of a display apparatus, according to an exemplary embodiment of the present invention.
Figure 7A:
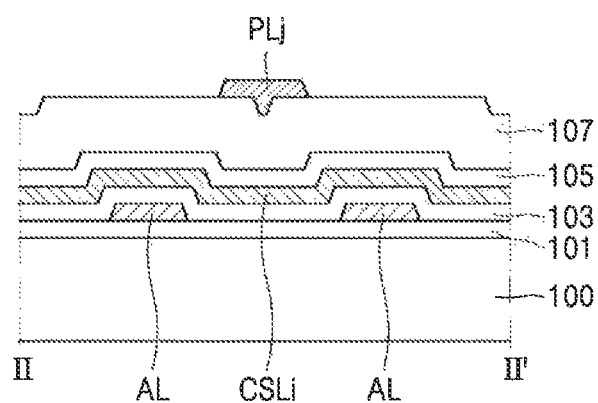
FIG. 7A is a cross-sectional view taken along a line II-II' of FIG. 6, according to an exemplary embodiment of the present invention.
Figure 7B:
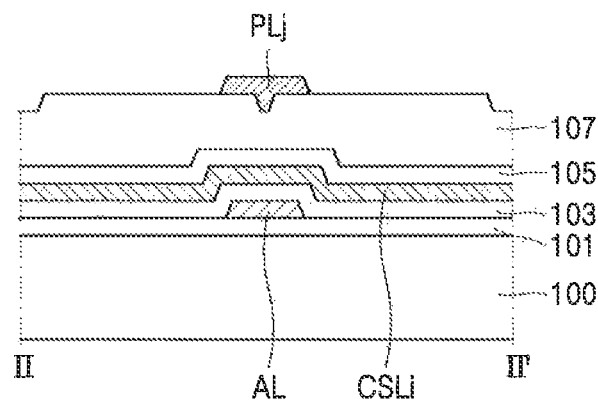
FIG. 7B is a cross-sectional view taken along a line II-II' of FIG. 6, according to exemplary embodiment of the present invention.

FIG. 6 is a plan view of a part of a display apparatus, according to an exemplary embodiment of the present invention. FIG. 7A is a cross-sectional view taken along a line II-II' of FIG. 6, according to an exemplary embodiment of the present invention, and FIG. 7B is a cross-sectional view taken along a line II-II' of FIG. 6, according to an exemplary embodiment of the present invention. While describing FIGS. 6 to 7B, reference numerals that are similar to that of FIGS. 4 and 5 may denote like elements, and thus, redundant descriptions may not be provided again.

Referring to FIG. 6, the display apparatus includes the substrate 100 having the trench portion TH led inward from one side of the substrate 100, and the substrate 100 includes the first and second display areas DA1 and DA2 spaced apart from each other based on the first non-display area NDA1 adjacent to the trench portion TH. For example, the trench portion TH and the first non-display area NDA1 may be provided between the first and second display areas DA1 and DA2.

The plurality of first scan lines SL1i transmitting scan signals respectively to a plurality of pixels are provided in the first display area DA1, and the plurality of second scan lines SL2i transmitting scan signals respectively to a plurality of pixels are provided in the second display area DA2.

The plurality of connection scan lines CSLi respectively connecting the plurality of first scan lines SL1i and the plurality of second scan lines SL2i are provided in the first non-display area NDA1, and the plurality of driving voltage lines PLj crossing and overlapping the plurality of connection scan lines CSLi are disposed on the plurality of connection scan lines CSLI with an insulating layer disposed therebetween.

A length of at least one of the plurality of driving voltage lines PLj provided in the first non-display area NDA1 may be different from the others. The number of connection scan lines CSLi overlapping each of the plurality of driving voltage lines PLj provided in the first non-display area NDA1 may be the same throughout the display apparatus.

For example, each of the connection scan lines CSLi may cross over each of the driving voltage lines PLj.

In the current embodiment, a plurality of additional load layers AL overlapping the plurality of connection scan lines CSLi may be provided in the first non-display area NDA1. The additional load layer AL may extend in the second direction, and may be provided not to overlap the driving voltage line PLj, as shown in FIGS. 6 and 7A, or may be provided to overlap the driving voltage line PLj, as shown in FIG. 7B.

When the plurality of additional load layers AL overlap the plurality of connection scan lines CSLi, parasitic capacitance or a load value may be adjusted. The number of plurality of connection scan lines CSLi overlapping each of the plurality of additional load layers AL may be the same. For example, each of the connection scan lines CSLi may cross over each of the additional load layers AL.

Referring to FIGS. 7A and 7B, the plurality of additional load layers AL may be provided on the buffer layer 101. The additional load layer AL may be formed of the same material and on the same layer as the driving and switching semiconductor layers A1 and A2. The additional load layer AL may have conductivity by being doped with an impurity.

The connection scan lines CSLi are disposed on the additional load layers AL. For example, the additional load layer AL may be provided below the connection scan line CSLi with the gate insulating layer 103 disposed therebetween, and the driving voltage line PLj is provided on the connection scan line CSLi. A load value may be adjusted by using upper and lower regions of the connection scan line CSLi, and thus, a design range of the load value may be widened.

Figure 8:
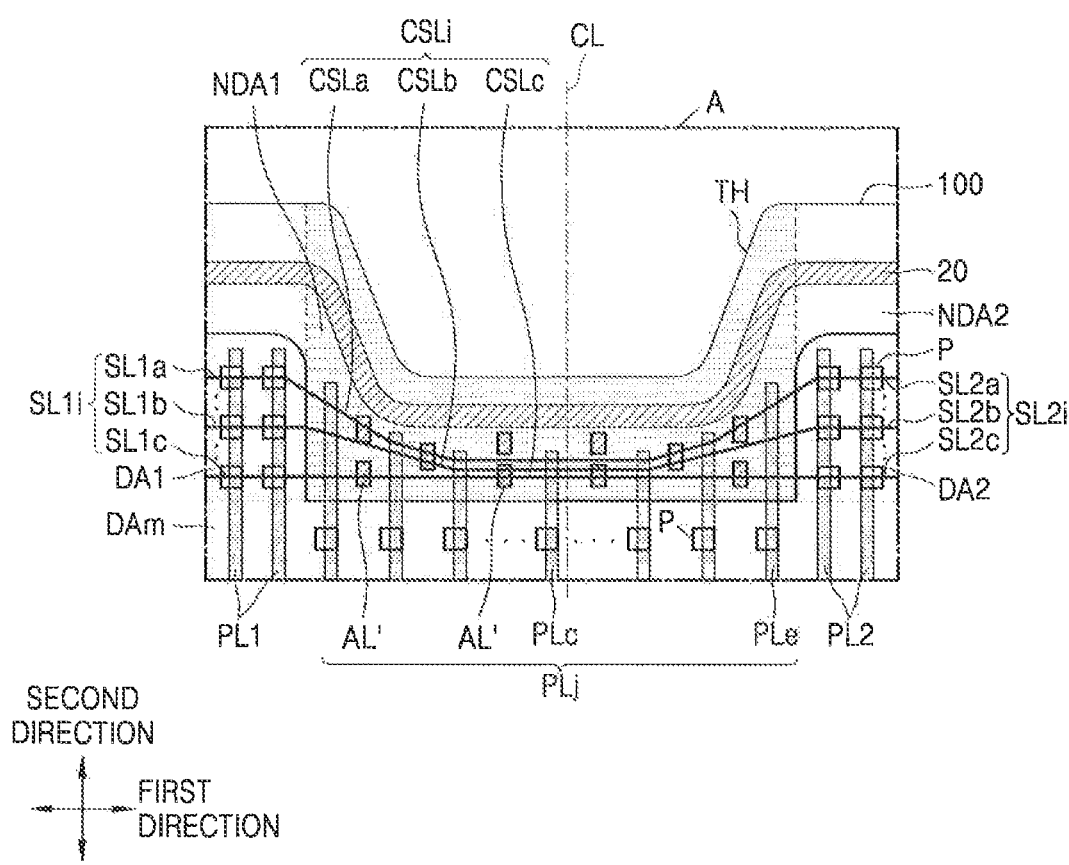
FIG. 8 is a plan view of a part of a display apparatus, according to an exemplary embodiment of the present invention.

FIG. 8 is a plan view of a part of a display apparatus, according to an exemplary embodiment of the present invention. While describing FIG. 8, reference numerals that are similar to that of FIG. 4 may denote like elements, and thus, redundant descriptions may not be provided again.

Referring to FIG. 8, the display apparatus includes the substrate 100 having the trench portion TH led inward from one side of the substrate 100, and the substrate 100 includes the first and second display areas DA1 and DA2 spaced apart from each other based on the first non-display area NDA1 adjacent to the trench portion TH.

The plurality of first scan lines SL1*i* transmitting scan signals respectively to a plurality of pixels are provided in the first display area DA1, and the plurality of second scan lines SL2*i* transmitting scan signals respectively to a plurality of pixels are provided in the second display area DA2.

The plurality of connection scan lines CSLi respectively connecting the plurality of first scan lines SL1*i* and the plurality of second scan lines SL2*i* are provided in the first non-display area NDA1, and the plurality of driving voltage lines PLj crossing and overlapping the plurality of connection scan lines CSLi are disposed on the plurality of connection scan lines CSLI with an insulating layer disposed therebetween.

A length of at least one of the plurality of driving voltage lines PLj provided in the first non-display area NDA1 may be different from the others. The number of connection scan lines CSLi overlapping each of the plurality of driving voltage lines PLj provided in the first non-display area NDA1 may be the same.

In the current embodiment, a plurality of additional load layers AL' overlapping the plurality of connection scan lines CSLI may be provided in the first non-display area NDA1. The additional load layer AL' may be patterned. For example, some of the additional load layers AL' may extend in the second direction at certain intervals. Accordingly, the number of connection scan lines CSLi overlapping each of the plurality of additional load layers AL' may not be the same. Parasitic capacitance or a load value may be adjusted by a region where the plurality of additional load layers AL' overlap the plurality of connection scan lines CSLi.

Figure 9:
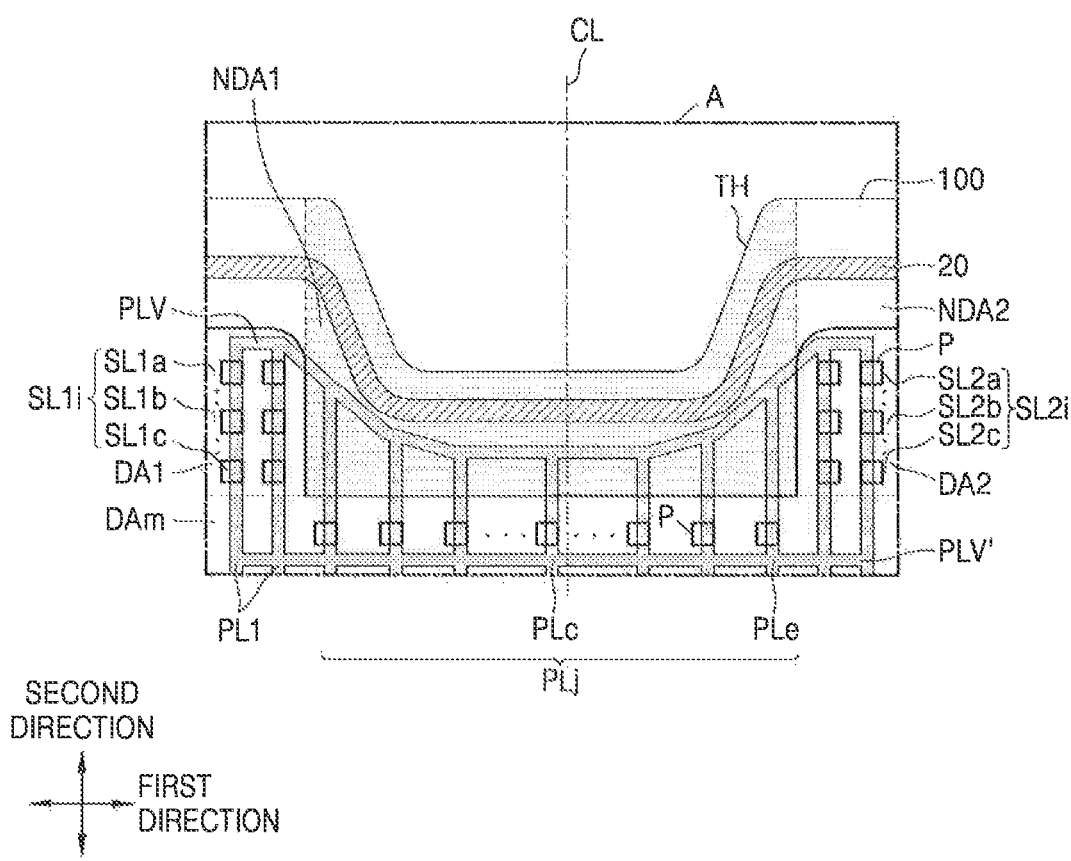
FIG. 9 is a plan view of a part of a display apparatus, according to an exemplary embodiment of the present invention.

FIG. 9 is a plan view of a part of a display apparatus, according to an exemplary embodiment of the present invention. While describing FIG. 9, reference numerals that are similar to that of FIG. 4 may denote like elements, and thus, redundant descriptions may not be provided again.

Referring to FIG. 9, the display apparatus includes the substrate 100 having the trench portion TH led inward from one side of the substrate 100, and the substrate 100 includes the first and second display areas DA1 and DA2 spaced apart from each other based on the first non-display area NDA1 adjacent to the trench portion TH.

The plurality of first scan lines SL1*i* transmitting scan signals respectively to a plurality of pixels are provided in the first display area DA1, and the plurality of second scan lines SL2*i* transmitting scan signals respectively to a plurality of pixels are provided in the second display area DA2.

The plurality of connection scan lines CSLi respectively connecting the plurality of first scan lines SL1*i* and the plurality of second scan lines SL2*i* are provided in the first non-display area NDA1, and the plurality of driving voltage lines PLj crossing and overlapping the plurality of connection scan lines CSLi are disposed on the plurality of connection scan lines CSLi with an insulating layer disposed therebetween.

A length of at least one of the plurality of driving voltage lines PLj provided in the first non-display area NDA1 may be different from the others. The number of connection scan lines CSLi overlapping each of the plurality of driving voltage lines PLj provided in the first non-display area NDA1 may be the same.

In the current embodiment, connection wires PLV and PLV' connecting the driving voltage lines PL1, PLj, and PL2 in a transverse direction (e.g., the first direction) are provided, and the driving voltage lines PL1, PLj, and PL2 and the connection wires PLV and PLV' may form a mesh structure. Accordingly, the connection wire PLV' extending in the first direction may be provided in the main area Dam. The connection wire PLV' may be formed of a same material and on a same layer as the driving voltage lines PL1, PLj, and PL2 to be integrated with the driving voltage lines PL1, PLj, and PL2. There may be a plurality of connection wires PLV.

The connection wire PLV may also be provided in the first non-display area NDA1. In this case, the connection wire PLV may be curved or bent according to the shape or curvature of the trench portion TH. According to an exemplary embodiment of the present invention, the connection wire PLV may connect end portions of the driving voltage lines PL1, PLj, and PL2.

Figure 10:
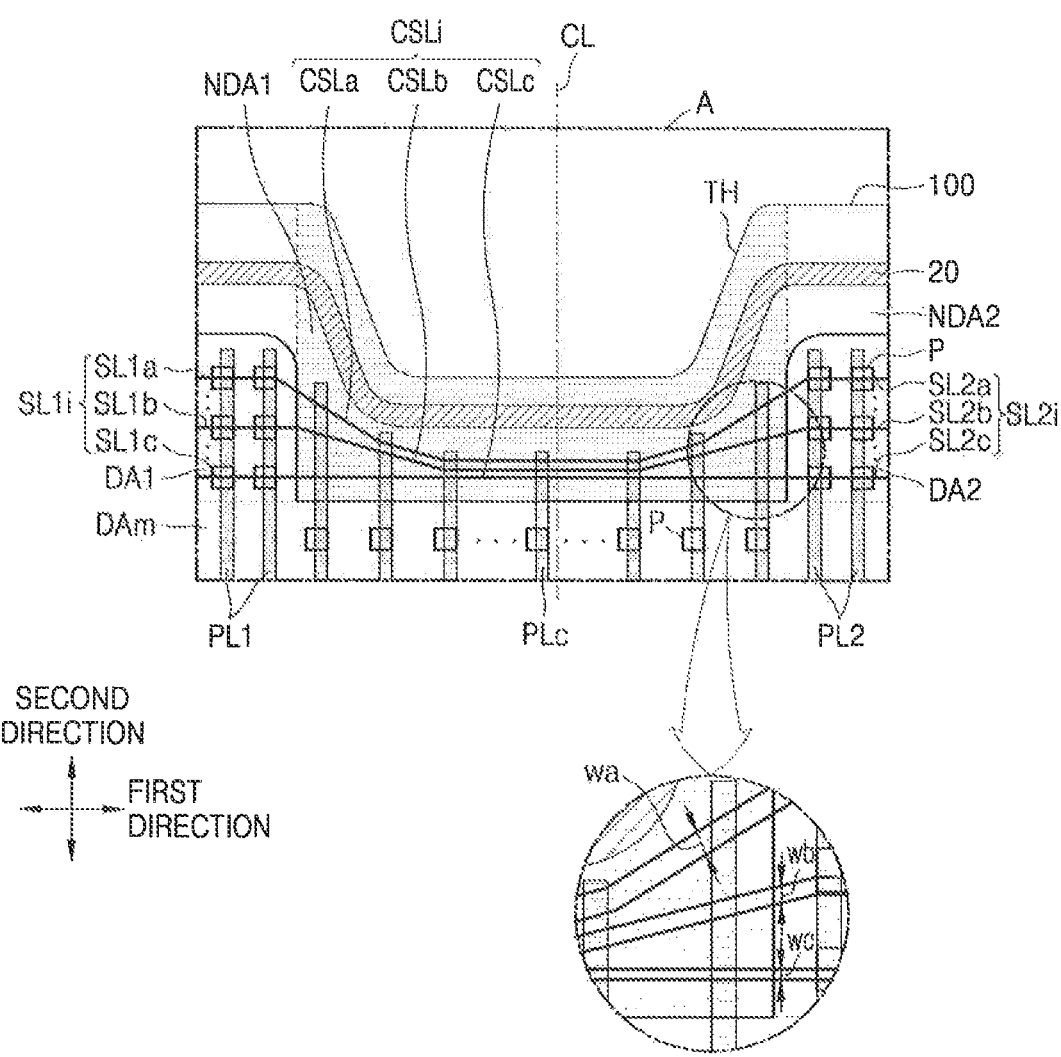
FIG. 10 is a plan view of a part of a display apparatus, according to an exemplary embodiment of the present invention.

FIG. 10 is a plan view of a part of a display apparatus, according to an exemplary embodiment of the present invention. While describing FIG. 10, reference numerals that are similar to that of FIG. 4 may denote like elements, and thus, redundant descriptions may not be provided again.

Referring to FIG. 10, the display apparatus includes the substrate 100 having the trench portion TH led inward from one side of the substrate 100, and the substrate 100 includes the first and second display areas DA1 and DA2 spaced apart from each other based on the first non-display area NDA1 adjacent to the trench portion TH.

The plurality of first scan lines SL1i transmitting scan signals respectively to a plurality of pixels are provided in the first display area DA1, and the plurality of second scan lines SL2i transmitting scan signals respectively to a plurality of pixels are provided in the second display area DA2.

The plurality of connection scan lines CSLi respectively connecting the plurality of first scan lines SL1i and the plurality of second scan lines SL2i are provided in the first non-display area NDA1, and the plurality of driving voltage lines PLj crossing and overlapping the plurality of connection scan lines CSLi are disposed on the plurality of connection scan lines CSLi with an insulating layer disposed therebetween.

A length of at least one of the plurality of driving voltage lines PLj provided in the first non-display area NDA1 may be different from the others. The number of connection scan lines CSLi overlapping each of the plurality of driving voltage lines PLj provided in the first non-display area NDA1 may be the same. The connection scan line CSLa adjacent to the trench portion TH among the plurality of connection scan lines CSLi may be longer than a connection scan line CSLc adjacent to the main area DAm. Accordingly, resistance values of the plurality of connection scan lines CSLi may be different from each other.

In the current embodiment, a width Wa of the connection scan line CSLa adjacent to the trench portion TH is greater than a width Wc of the connection scan line CSLc adjacent to the main area DAm. In other words, widths of the plurality of connection scan lines CSLi may be different from each other, and may be larger towards the trench portion TH, e.g., Wa>Wb>Wc. Accordingly, the resistance values of the plurality of connection scan lines CSLi may be uniform, and thus the load value may be adjusted.

Figure 11:
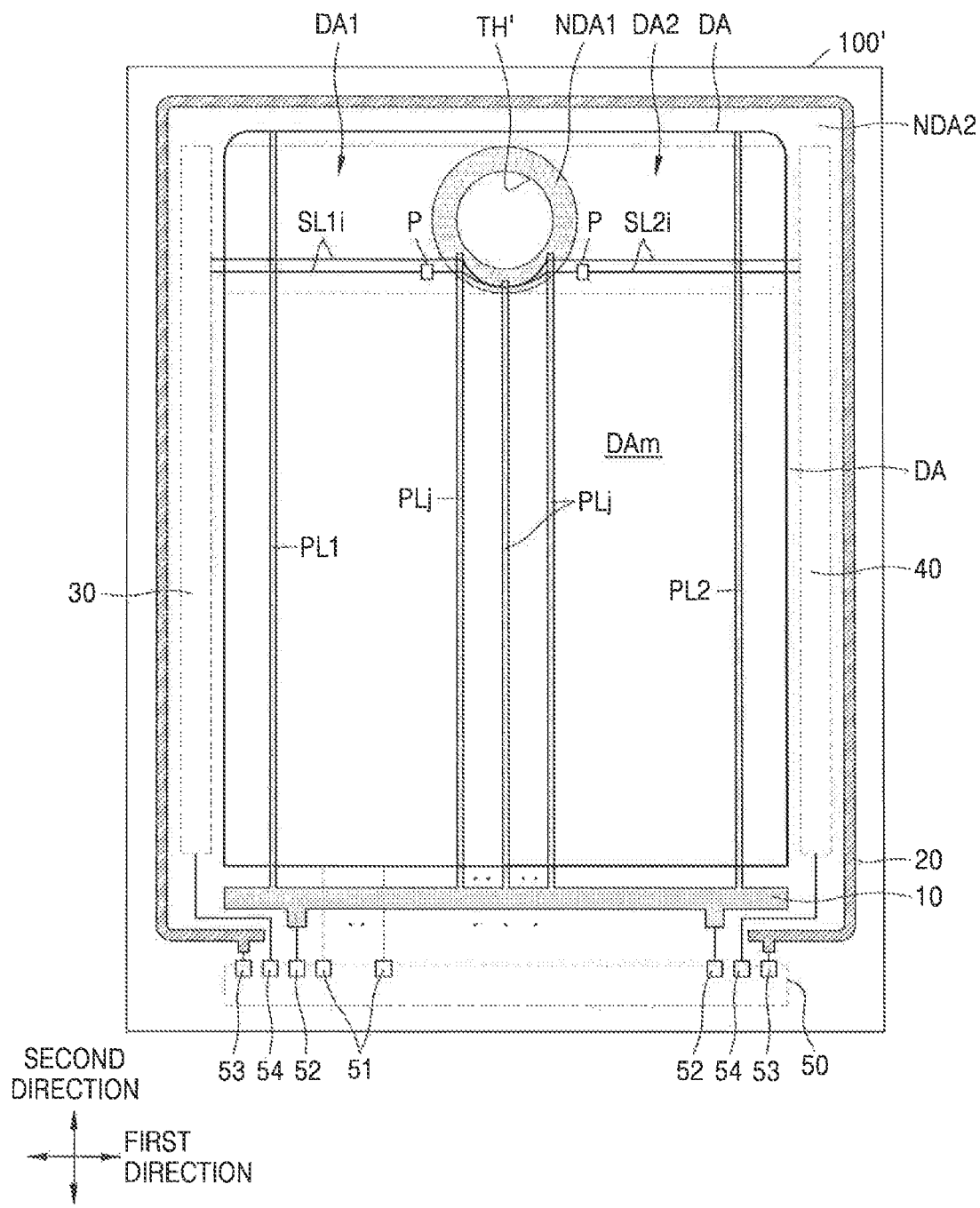
FIG. 11 is a plan view of a display apparatus according to an exemplary embodiment of the present invention.

FIG. 11 is a plan view of a display apparatus according to an exemplary embodiment of the present invention. While describing FIG. 11, reference numerals that are similar to that of FIG. 3 may denote like elements, and thus, redundant descriptions may not be provided again.

In exemplary embodiments of the present invention described with reference to FIGS. 1 through 10, the trench portion TH obtained by removing part of one side of the substrate 100 is described, but the substrate 100 is not limited thereto. For example, as shown in FIG. 11, a penetrating portion TH' may be formed through a substrate 100'.

Referring to FIG. 11, the display apparatus includes the substrate 100' having the penetrating portion TH' that penetrates top and bottom surfaces of the substrate 100', and the substrate 100' includes the first and second display areas DA1 and DA2 spaced apart from each other based on the first non-display area NDA1 adjacent to the penetrating portion TH'.

The plurality of first scan lines SL1i transmitting scan signals respectively to a plurality of pixels are provided in the first display area DA1, and the plurality of second scan lines SL2i transmitting scan signals respectively to a plurality of pixels are provided in the second display area DA2.

The plurality of connection scan lines CSLI respectively connecting the plurality of first scan lines SL1i and the plurality of second scan lines SL2i are provided in the first non-display area NDA1, and the plurality of driving voltage lines PLj crossing and overlapping the plurality of connection scan lines CSLI are disposed on the plurality of connection scan lines CSLi with an insulating layer disposed therebetween.

A length of at least one of the plurality of driving voltage lines PLj provided in the first non-display area NDA1 may be different from the others. The number of plurality of connection scan lines CSLi overlapping each of the plurality of driving voltage lines PLj provided in the first non-display area NDA1 may be the same.

Accordingly, parasitic capacitance and load in the first and second display areas DA1 and DA2 may be adjusted, thereby preventing luminance irregularity according to locations in the display area DA.

According to an exemplary embodiment of the present invention, node matching may be achieved by overlapping a driving voltage line and a connection scan line in a non-display area, and thus a display apparatus may provide a high-quality image.

While the present invention has been particularly shown and described with reference to exemplary embodiments thereof, it will be apparent to those of ordinary skill in the art that various changes in form and detail may be made thereto without departing from the spirit and scope of the present invention as defined by the following claims.

What is claimed is:

1. A display apparatus comprising
a substrate including a display area and a non-display area, wherein the display area comprises a first display area and a second display area, and the non-display area at least partially disposed between the first display area and the second display area;
a pixel circuit and a display element electrically connected to the pixel circuit, each arranged in the display area;
a plurality of first lines extending along a first direction from the first display area to the second display area, the plurality of first lines is curved in the non-display area;
a plurality of second lines disposed in the display area and the non-display area, and extending in a second direction crossing the first direction;
an insulating layer is disposed between the plurality of second lines and the plurality of first lines; and
a second power voltage line disposed in the non-display area,
wherein the plurality of the second lines crosses the plurality of first lines in the non-display area,
wherein, in the non-display area, a first-second line and a second-second line of the plurality of second lines are spaced apart from each other, wherein the first-second line has a different length from that of the second-second line,
wherein each of the plurality of first lines comprises a curved portion that are curved and do not vertically overlap the second power voltage line.

2. The display apparatus of claim 1, wherein the plurality f first lines comprises a first-first connection line and a first-second line, and
a degree of curvature of the first-first line and a degree of curvature of the first-second line are different from each other.

3. The display apparatus of claim 1, wherein at least one of the plurality of second lines has a length different from that of other second lines.

4. The display apparatus of claim 1, wherein the numbers of the plurality of first lines overlapping each of the plurality of second lines are the same.

5. The display apparatus of claim 1, wherein the substrate includes a trench portion recessed from one side of the substrate to the display area in a plan view, wherein the trench portion is disposed between the first display area and the second display area.

6. The display apparatus of claim 5, wherein the plurality of first lines includes a first-first line adjacent to the trench portion and a first-second line adjacent to the display area, wherein the first-first line is longer than the first-second line.

7. The display apparatus of claim 1, further comprising a plurality of additional load layers provided in the non-display area and overlapping the plurality of first lines.

8. The display apparatus of claim 7, wherein the pixel circuit comprises: a thin-film transistor comprising a semiconductor layer; and a data line electrically connected to the thin-film transistor,
wherein the plurality of additional load layers are provided on a same layer as the semiconductor layer, and the plurality of second lines are provided on a same layer as the data line.

9. The display apparatus of claim 1, wherein the plurality of second lines includes a second-first line disposed in the first display area and a second-second line extending to the non-display area, wherein the second-first line has a length greater than that of the second-second line.

10. The display apparatus of claim 1, further comprising:
a first power voltage line extending in a first direction and disposed in the non-display area,
wherein the plurality of the second lines extend from the first power voltage line, and
a plurality of end portions of the plurality of the second lines are spaced apart from the second power voltage line in a plane view.

11. The display apparatus of claim 1, further comprising a plurality of connection voltage lines crossing the plurality of second lines, wherein the plurality of connection voltage lines extends from the plurality of second lines.

12. A display apparatus comprising:
a substrate including a display area and a non-display area, wherein the display area comprises a first display area and a second display area, and the non-display area at least partially disposed between the first display area and the second display area;
a pixel circuit and a display element electrically connected to the pixel circuit, each arranged in the display area;
a plurality of first scan lines disposed in the first display area and extending along a first direction;
a plurality of second scan lines disposed in the second display area and extending along the first direction;
a plurality of connection lines connecting the plurality of first scan lines to the plurality of second scan lines and disposed in the non-display area, wherein the plurality of connection lines have different widths, which are in a second direction crossing the first direction, from each other;
a plurality of driving voltage lines disposed in the display area and in the non-display area, and extending in the second direction crossing the first direction; and
an insulating layer is disposed between the plurality of driving voltage lines and the plurality of connection lines,
wherein the plurality of the driving voltage lines crosses the plurality of correction lines in the non-display area.

13. The display apparatus of claim 12, wherein at least one of the plurality of connection lines include a curved portion.

14. The display apparatus of claim 12, wherein at least one of the plurality of driving voltage lines has a length different from that of other driving voltage lines.

15. The display apparatus of claim 12, wherein the plurality of connection lines, the plurality of first scan lines, and the plurality of second scan lines are provided on a same layer.

* * * * *